United States Patent
Tseng et al.

(10) Patent No.: US 10,319,618 B2
(45) Date of Patent: Jun. 11, 2019

(54) METAL RECYCLING METHOD AND METAL RECYCLING EQUIPMENT THEREOF

(71) Applicant: EPISTAR CORPORATION, Hsinchu (TW)

(72) Inventors: Chun-Lung Tseng, Hsinchu (TW); Hung-Yao Lin, Hsinchu (TW); Hsin-Yi Wang, Hsinchu (TW); Chin-Kang Hu, Hsinchu (TW); Sheng-Hsiung Chuang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 120 days.

(21) Appl. No.: 15/276,141

(22) Filed: Sep. 26, 2016

(65) Prior Publication Data

US 2017/0092528 A1 Mar. 30, 2017

(30) Foreign Application Priority Data

Sep. 25, 2015 (TW) .............................. 104131722 A

(51) Int. Cl.
| | |
|---|---|
| *B44C 1/14* | (2006.01) |
| *H05K 3/02* | (2006.01) |
| *H05K 3/04* | (2006.01) |
| *B32B 37/00* | (2006.01) |
| *B32B 38/10* | (2006.01) |
| *H01L 21/67* | (2006.01) |

(52) U.S. Cl.
CPC ...... *H01L 21/67132* (2013.01); *B32B 37/025* (2013.01); *B32B 38/10* (2013.01); *H01L 21/67092* (2013.01); *H05K 3/025* (2013.01); *H05K 3/046* (2013.01); *B32B 2309/12* (2013.01); *B32B 2311/00* (2013.01); *B32B 2311/02* (2013.01); *B32B 2311/12* (2013.01); *B32B 2311/24* (2013.01); *B32B 2457/14* (2013.01); *B44C 1/14* (2013.01)

(58) Field of Classification Search
CPC ............. B32B 2309/12; B32B 2311/00; B32B 2311/02; B32B 2311/12; B32B 2311/24; B32B 2457/14; B32B 37/025; B32B 38/10; H01L 21/67092; H01L 21/67132; B44C 1/14; H05K 3/025; H05K 3/046
USPC ......................................................... 156/233
See application file for complete search history.

(56) References Cited

U.S. PATENT DOCUMENTS

| | | | |
|---|---|---|---|
| 2009/0199960 A1* | 8/2009 | Nuzzo | .................... B82Y 10/00 156/230 |
| 2014/0087191 A1* | 3/2014 | Chua | .................... H01L 21/2007 428/408 |

FOREIGN PATENT DOCUMENTS

| | | | |
|---|---|---|---|
| CN | 102230307 A | * | 11/2011 |
| WO | WO-2018103044 A1 | * | 6/2018 |

OTHER PUBLICATIONS

English translation of CN102230307A.*

* cited by examiner

*Primary Examiner* — Sonya M Sengupta
(74) *Attorney, Agent, or Firm* — Ditthavong & Steiner, P.C.

(57) ABSTRACT

A metal recycling method comprises attaching a tape to a metal layer of a semiconductor structure; and separating a part of the metal layer from the semiconductor structure and transferring the part of the metal layer to the tape by a pressure difference.

19 Claims, 13 Drawing Sheets

FIG. 1D"

METAL RECYCLING METHOD AND METAL RECYCLING EQUIPMENT THEREOF

TECHNICAL FIELD

This present disclosure relates to metal recycling equipment and a method for recycling the metal on a surface of a wafer by the metal recycling equipment, and more particularly to a metal recycling equipment suitable for applying to the procedures of manufacturing a light-emitting device and a method for recycling the metal on a surface of a light-emitting wafer by the metal recycling equipment.

DESCRIPTION OF BACKGROUND ART

Metal removing procedure comprises attaching a tape to a surface of a wafer, more specifically, attaching the tape to a metal on the surface of the wafer, and then separating the tape from the surface of the wafer. By this way, the unnecessary metal could be removed and the necessary metal could be retained.

There are three kinds of usual methods for removing the metal through attaching the tape on the wafer:

(1) Man-made: this method mainly comprises first attaching the tape to the surface of the wafer, and then repeatedly pressing the tape to adhere the tape to the metal on the surface of the wafer, and finally separating the tape from the wafer. Therefore, the unnecessary metal could be separated from the wafer and transferred to the tape, and the necessary metal could be retained. However, it must repeatedly press the tape to fully adhere the tape to the metal on the surface of the wafer. Meanwhile, a force is also applied to the metal or the photo-resistor so the metal or the photo-resistor is prone to deform and the wafer yield would be decreased. Furthermore, it is hard to control every forces applying to the tape each time. The tape might not fully adhere to the surface of the wafer, hence the unnecessary metal would not be fully removed and the wafer yield may drop.

(2) Machine: this method mainly comprises adhering the tape to the surface of the wafer by a fixture, and then the fixture repeatedly pressing the tape to adhere the tape to the metal on the surface of the wafer, and finally a machine driving the tape to tear the tape from the wafer. The unnecessary metal is transferred to the tape and separated from the wafer, and the necessary metal is retained. However, since the wafer is prone to warp in the process, the pressure repeatedly applied by the fixture on the tape will cause the wafer to break. Moreover, there are concave-convex positions on the surface of the wafer, and the fixture has difficulty to press those concave-convex positions. Therefore, the adhesive ability between the metal and the tape is weak, and it would decrease the wafer yield since the unnecessary metal could not be fully removed.

(3) Chemical solutions: this method comprises soaking the wafer in the chemical solution to loosen the photo-resistor on the surface of the wafer (this step could be omitted depending on the technique). Then, spreading two pressurized fluids (water and air) or three pressurized fluids (water, air and steam) on the surface of the wafer in order to expel the photo-resistor and the unnecessary metal thereon away from the surface of the wafer and retain the necessary metal. However, when the temperature of the chemical solutions changes violently, the wafer will break. After the chemical solutions spread on the surface of the wafer, the electrical properties of the wafer are likely to be abnormal since the static electricity occurred then. Moreover, the removed metal is prone to scrap the surface of the wafer when being driven by the chemical solutions.

SUMMARY OF THE DISCLOSURE

The present disclosure provides a metal recycling method, which comprises adhering a tape to a metal layer of a semiconductor structure; and separating a part of the metal layer from the semiconductor structure and transferring the part of the metal layer to the tape by a difference of gas pressure.

BRIEF DESCRIPTION OF THE DRAWINGS

FIG. 1D' shows the cross-sectional view of one of the step of the metal recycling method for recycling the metal on wafer surface in accordance with one embodiment of the present disclosure.

FIG. 1D" shows the cross-sectional view of one of the metal recycling method for recycling the metal on wafer surface in accordance with one embodiment of the present disclosure.

FIG. 2D' shows the cross-sectional view of one of the step of the metal recycling method for recycling the metal on wafer surface in accordance with one embodiment of the present disclosure.

FIG. 3D' shows the cross-sectional view of one of the step of the metal recycling method for recycling the metal on wafer surface in accordance with one embodiment of the present disclosure.

DETAILED DESCRIPTION OF THE PRESENT DISCLOSURE

Figure 1A:
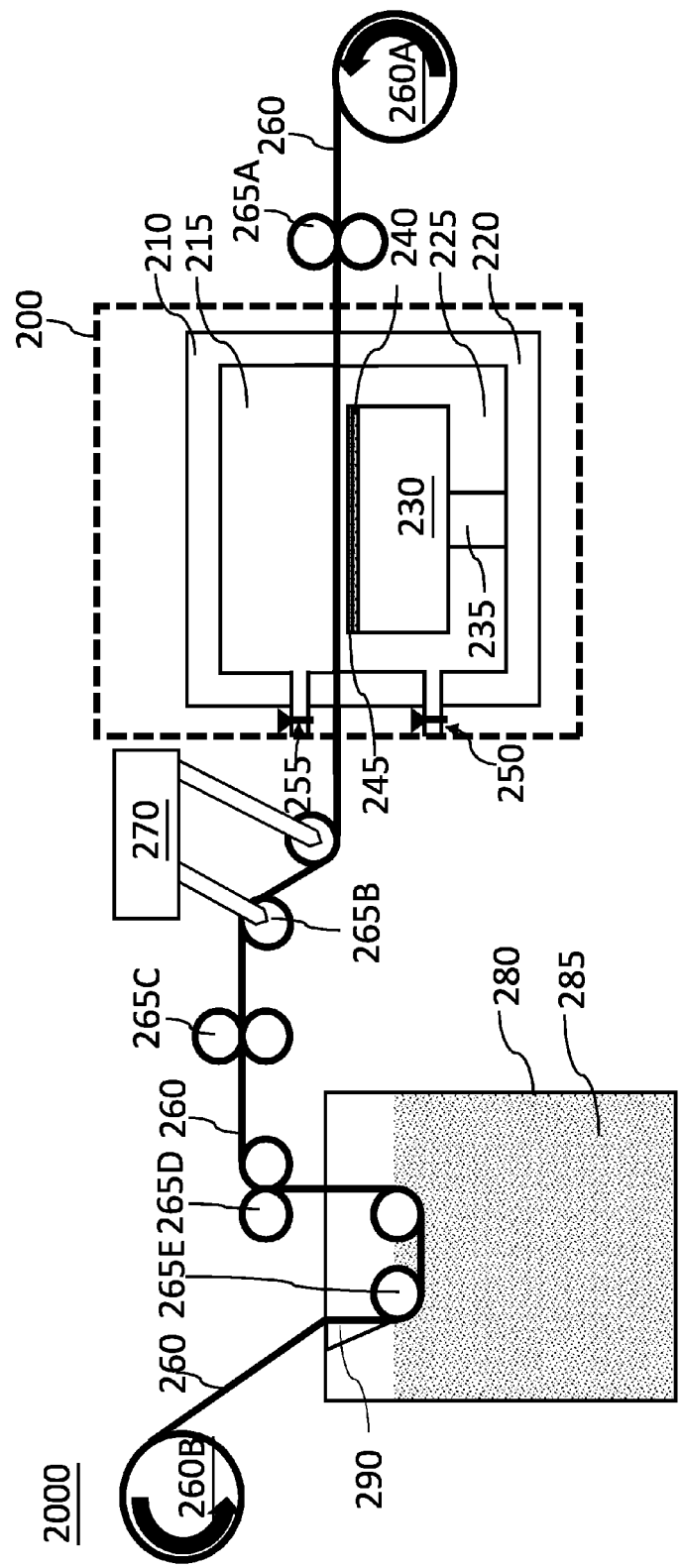
FIG. 1A shows the cross-sectional view of the metal recycling equipment in accordance with one embodiment of the present disclosure.

The embodiments of the application are illustrated in details, and are plotted in the drawings. The same or the similar parts are illustrated in the drawings and the specification with the same reference numeral.

FIG. 1A shows the metal recycling equipment 2000 in accordance with one embodiment of the present disclosure. The metal recycling equipment 2000 comprises a first roll 260A, a tape 260 for recycling the metal, a metal removing apparatus 200, a moving roll 265B, a metal recycling tank 280, a guiding roll 265E and a second roll 260B. The metal removing apparatus 200 comprises an upper chamber body 210 comprising an upper hollow cavity 215, a first pressure controlling tube 255 connecting to the upper chamber body 210 to control the pressure P1 in the upper hollow cavity 215, a lower chamber body 220 comprising a lower hollow cavity 225 and a second pressure controlling tube 250 connecting to the lower chamber body 220 to control the pressure P2 in the lower hollow cavity 225. A wafer carrier 230 and a lifting shaft 235 connecting to the wafer carrier 230 locate in the lower hollow cavity 225. The lifting shaft 235 can control the lift and the fall of the wafer carrier 230. Moreover, the upper chamber body 210 and/or the lower chamber body 220 can move relatively to each other. The moving roll 265B drives the tape 260 on the first roll 260A and makes the tape 260 go in and out of the metal removing apparatus 200. The metal recycling tank 280 fills with the metal recycling liquid 285, and the guiding roll 265E locates in the metal recycling tank 280 to guide the tape 260 from the metal removing apparatus 200 via the moving roll 265B into or out of the metal recycling tank 280. The second roll 260B is designated to recycle the tape 260. The moving roll 265B rotates and is driven by the motor 270. Moreover, the metal recycling equipment 2000 further comprises a first pressure roll 265A between the first roll 260A and the metal removing apparatus 200, a deflecting roll 265D between the moving roll 265B and the guiding roll 265E, and a second pressure roll 265C between the moving roll 265B and the deflecting roll 265D. The deflecting roll 265D is designated to deflect the tape 260 from the metal removing apparatus 200 via the moving roll 265B into the metal recycling tank 280.

The tape 260 in this embodiment could be blue tape, release tape (such as UV release tape or thermal release tape), polyethylene terephthalate (PET) or the combination thereof. The metal recycling liquid 285 could be water or organic solvent with the temperature between 30~100 Celsius degree.

Figure 1B:
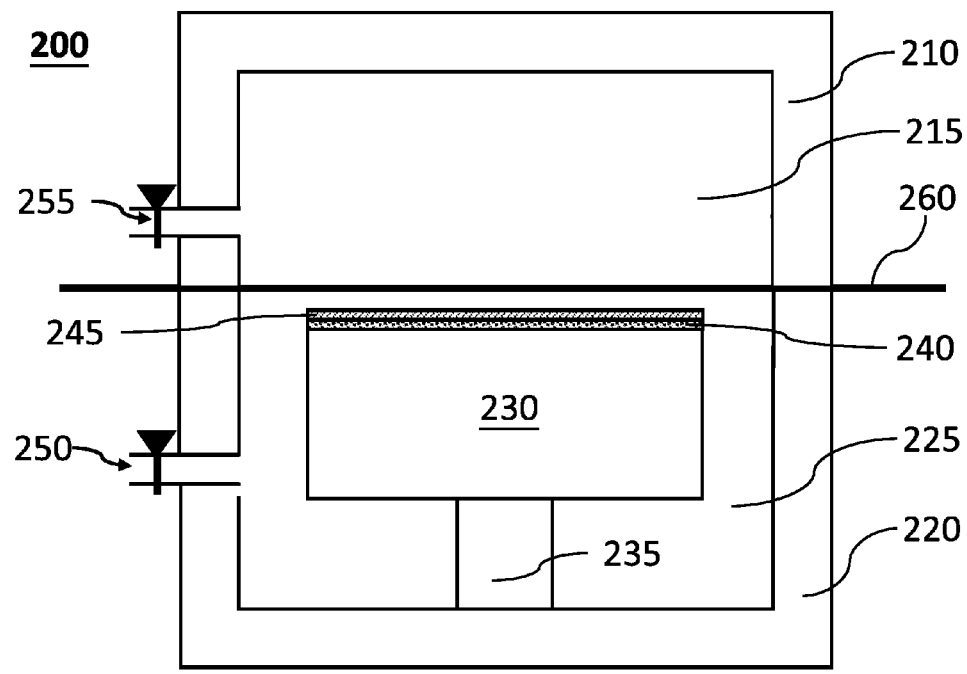
FIGS. 1B to 1E show the cross-sectional view of the metal recycling method for recycling the metal on wafer surface by using the metal removing equipment shown in FIG. 1A.
Figure 1C:
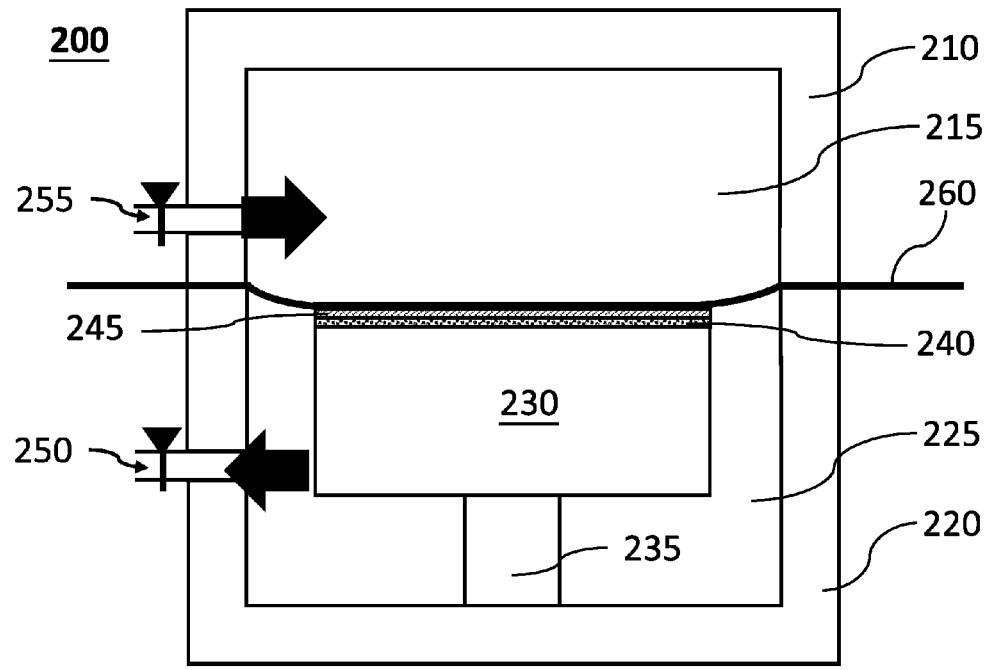
Figure 1D:
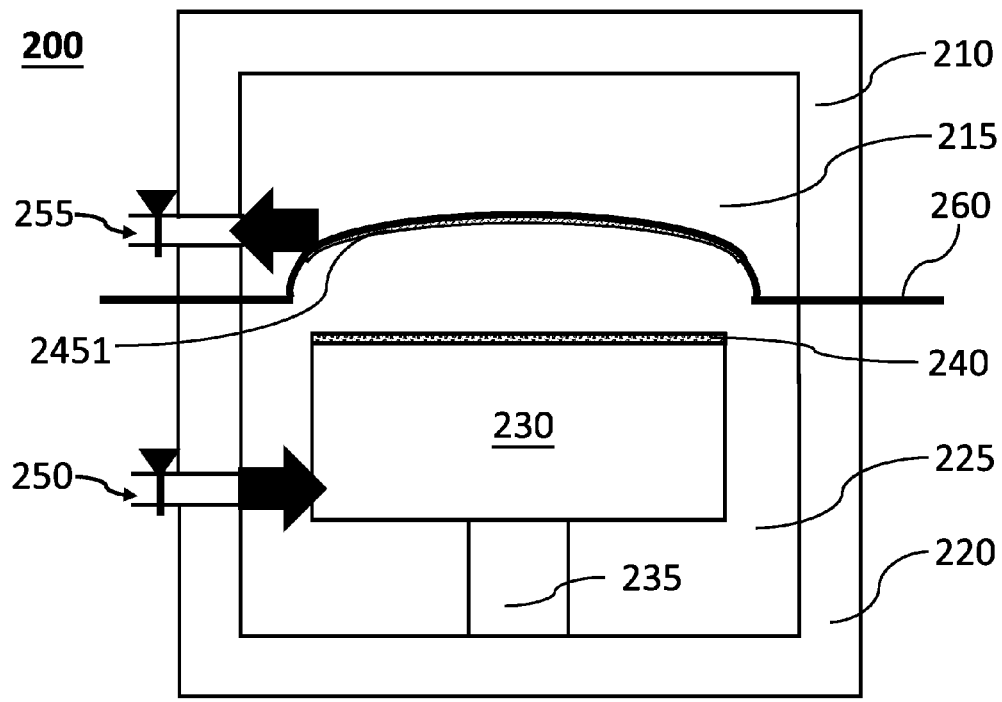
Figure 1D:
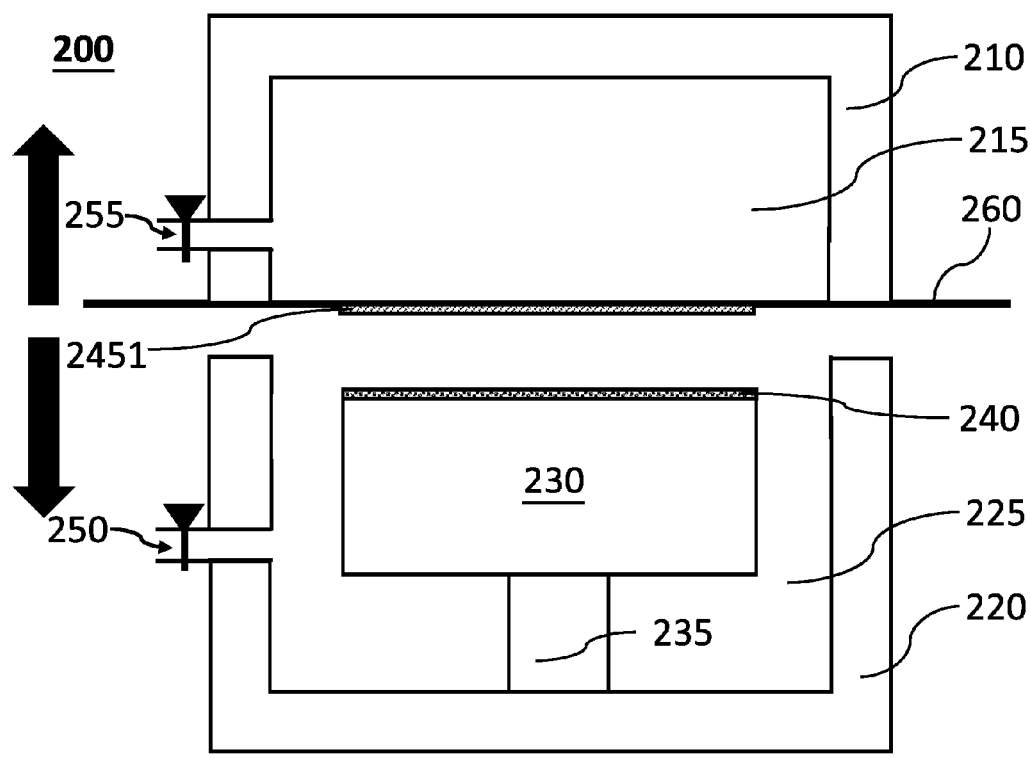
Figure 4A:
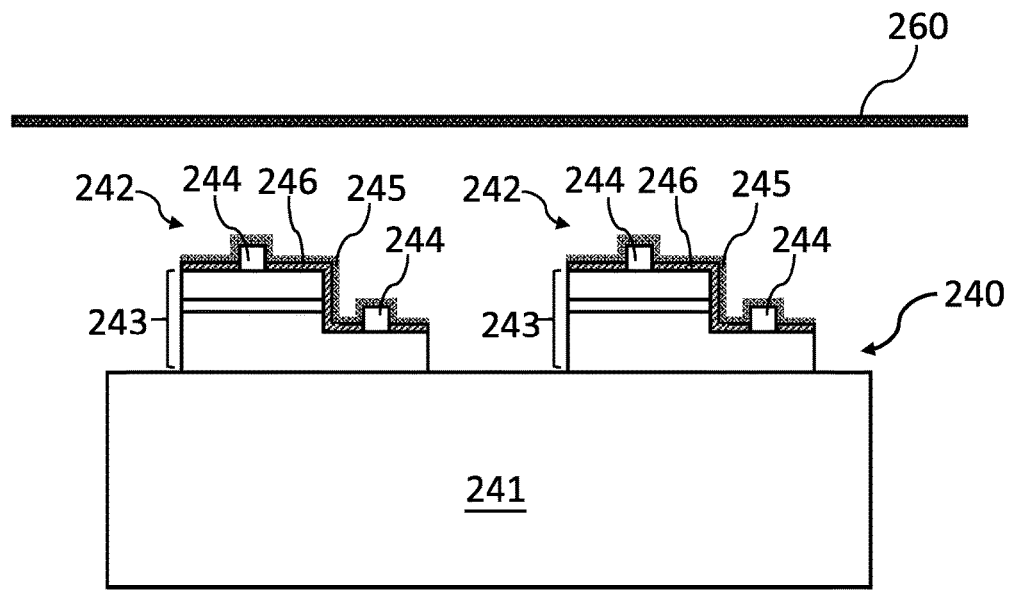
FIGS. 4A to 4C show the enlarged cross-sectional view of the tape and the wafer.
Figure 4B:
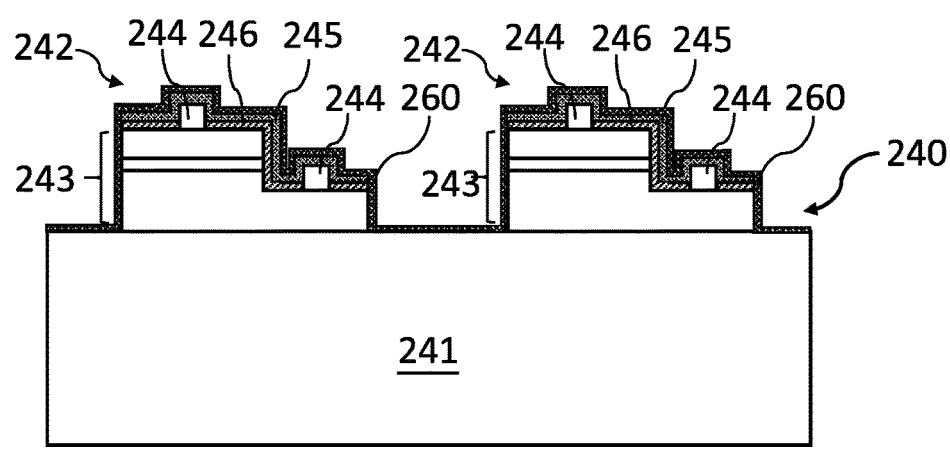
Figure 4C:
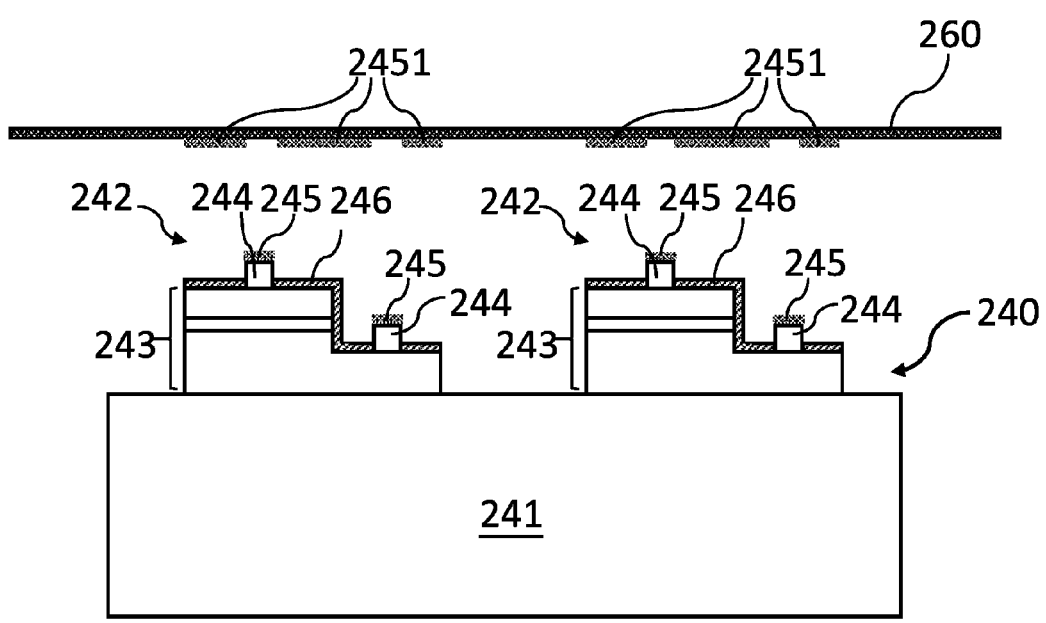

FIGS. 1B~1E show the cross-sectional view of the metal recycling method for recycling the metal on wafer surface by using the metal removing apparatus 200 shown in FIG. 1A. FIGS. 4A to 4C show the enlarged cross-sectional view of the tape and the wafer as shown in FIGS. 1B~1D. The two semiconductor structures 242 are just for illustration, and the amount and the arrangement of the semiconductor structures 242 are not limited by FIGS. 4A~4C.

Referring to FIGS. 1B and 4A, a wafer 240 locates on the wafer carrier 230. The wafer 240 comprises a substrate 241 and a plurality of the semiconductor structures 242 on the substrate 241. Each of the semiconductor structure 242 comprises a semiconductor stack 243, a pair of the electrodes 244 formed on the semiconductor stack 243, a sacrificial layer 246 (e.g. photo-resistor) formed on the semiconductor stack 243 and not deposited on the electrodes 244, and a metal layer 245 formed on the electrode 244 and the sacrificial layer 246.

Referring to FIGS. 1A and 1B, the moving roll 265B driven by the motor 270 moves the tape 260 in the first roll 260A to the metal removing apparatus 200 through the first pressure roll 265A so the tape 260 is positioned between the upper chamber body 210 and lower chamber body 220. A projected areas of the upper hollow cavity 215 and lower hollow cavity 225 which are projected toward the tape 260 should be located fully in a peripheral range of the tape 260, and more preferably, the projected areas of the upper chamber body 210 and the lower chamber body 220 which are projected toward the tape 260 also locate fully in the peripheral range of the tape 260. Then, moving the upper chamber body 210, the lower chamber body 220 or both of them (for example: low the upper chamber body 210 and/or lift the lower chamber body 220) to connect the upper chamber body 210 and the lower chamber body 220, and the tape 260 divides the upper hollow cavity 215 from the lower hollow cavity 225. Volumes of the upper hollow cavity 215 and the lower hollow cavity 225 are changed according to the shape of the tape 260. For example: when one of them is increased, the other one is reduced, but a total volume of the upper hollow cavity 215 and the lower hollow cavity 225 remains the same. In other words, the upper hollow cavity 215 and the tape 260 form an upper enclosed space and the lower hollow cavity 225 and the tape 260 form a lower enclosed space respectively. Volumes of the upper enclosed space and the lower enclosed space are changed according to the shape change of the tape 260.

Referring to FIGS. 1C and 4B, controlling the pressure P1 in the upper hollow cavity 215 and the pressure P2 in the lower hollow cavity 225 and making P1 larger than P2 (P1>P2). Due to the pressure difference between the upper hollow cavity 215 and the lower hollow cavity 225, the tape 260 in the metal removing apparatus 200 extends toward the wafer 240 and attaches to the surface of the wafer 240 conformably and adhere to the metal layer 245. Meanwhile, the tape 260 is under an expanded situation. The pressure difference $\Delta P$, equal to P1-P2, is about 1.5~3.5 atm. The step mentioned above, which makes the pressure P1 in the upper hollow cavity 215 higher than the pressure P2 in the lower hollow cavity 225, could be fulfilled by one of the following three steps S1~S3:

(S1) inflating the upper hollow cavity 215 through the first pressure controlling tube 255 to increase the pressure P1 in the upper hollow cavity 215 to 40~60 PSI (2.72~4.08 atm), while the lower hollow cavity 225 is not inflated and maintain the pressure P2 in 1 atm;

(S2) inflating the upper hollow cavity 215 through the first pressure controlling tube 255 to increase the pressure P1 in the upper hollow cavity 215 to 40~60 PSI (2.72~4.08 atm), while exhausting the lower hollow cavity 225 through the second pressure controlling tube 250 to decrease the pressure P2 in the lower hollow cavity 225 to lower than 1 atm in order to make the tape 260 adhere to the surface of the wafer 240 more rapidly and enhance the force and the stress applied on the wafer 240;

(S3) exhausting the lower hollow cavity 225 through the second pressure controlling tube 250 to decrease the pressure P2 in the lower hollow cavity 225 to lower than 1 atm (for example: $0.5~10^{-3}$ atm), while the upper hollow cavity 215 is not inflated and maintains the pressure P1 in 1 atm.

Referring to FIGS. 1D and 4C, the pressure P1 in the upper hollow cavity 215 and the pressure P2 in the lower hollow cavity 225 are controlled and the pressure P1 is lower than the pressure P2. Therefore, the tape 260 with the metal layer 245 adhering thereon moves toward a direction which is away from the wafer 260, and a part of the metal layer 245 which is on the sacrificial layer 246 is removed from the wafer 240 and transferred to the tape 260 to form a metal structure 2451 shown in FIG. 4C. More specifically, since a bonding force between the metal layer 245 and the sacrificial layer 246 is smaller than a bonding force between the metal layer 245 and the electrode 244, an adhesive force between the tape 260 and the metal layer 245 on the sacrificial layer 246 is larger than the bonding force between the metal layer 245 and the sacrificial layer 246. However, an adhesive force between the tape 260 and the metal layer 245 on the electrode 244 is smaller than the bonding force between the metal layer 245 and the electrode 244 so that a part of the metal layer 245, that is, the metal layer 245 which is not deposited on the electrode 244, could be removed when the tape 260 is torn off. Therefore, when the pressure P2 in the lower hollow cavity 225 is increased gradually or rapidly and becomes higher than the pressure P1 in the upper hollow cavity 215, the tape 260 moves upwardly and is separated from the wafer 240, and meanwhile the metal layer 245 on the sacrificial layer 245 is transferred from the sacrificial layer 246 to the tape 260 so that the metal layer 245 comes off from the sacrificial layer 246. The metal layer 245 on the electrodes remains on the semiconductor stack 243 and does not transfer to the tape 260. Meanwhile, the tape 260 is still under the expanded situation with the metal structure 2451 adhered thereon.

The detailed steps to fulfill P1<P2 are listed as follows. More specifically, the following shows the detailed steps to fulfill P1<P2 after the pressure P1 in the upper hollow cavity 215 is higher than the pressure P2 in the lower hollow cavity 225 as the above step (S2) described. First, the pressure P1 in the upper hollow cavity 215 is reduced to 1 atm, and meanwhile the exhaustion of the lower hollow cavity 225 is stopped and then the lower hollow cavity 225 is inflated in order to resume the pressure P2 to 1 atm. Meanwhile, the tape 260 still adheres to the metal layer 245. Then, the lower hollow cavity 225 is inflated through the second pressure controlling tube 250 to increase the pressure P2 in the lower hollow cavity 225 to 40~60 PSI (2.72~4.08 atm). At this moment, the pressure difference between the upper hollow cavity 215 and lower hollow cavity 225 ($\Delta P=1.5\sim 3.5$ atm) makes the tape 260 in the metal removing apparatus 200 move upwardly to separate the metal layer 245 on the sacrificial layer 246 from the surface of the wafer 240. The detailed description of the tape 260 and the metal layer 245 can be referred to the above relevant paragraphs.

The following shows the detailed steps to fulfill P1<P2 after the pressure P1 in the upper hollow cavity 215 is higher than the pressure P2 in the lower hollow cavity 225 as the above step (S1) described. First, the pressure P1 in the upper hollow cavity 215 is reduced to 1 atm. Then, the lower hollow cavity 225 is inflated through the second pressure controlling tube 250 to increase the pressure P2 to 40~60 PSI (2.72~4.08 atm). Similarly, the pressure difference between the upper hollow cavity 215 and lower hollow cavity 225 ($\Delta P=1.5\sim 3.5$ atm) makes the tape 260 in the metal removing apparatus 200 move upwardly to separate the metal layer 245 on the sacrificial layer 246 from the surface of the wafer 240. The detailed description of the tape 260 and the metal layer 245 can be referred to the above relevant paragraphs.

The following shows the detailed steps to fulfill P1<P2 after the pressure P1 in the upper hollow cavity 215 is higher than the pressure P2 in the lower hollow cavity 225 as the above step (S3) described. The lower hollow cavity 225 is inflated to increase the pressure P2 to 40~60 PSI (2.72~4.08 atm). Similarly, the pressure difference between the upper hollow cavity 215 and lower hollow cavity 225 ($\Delta P=1.5\sim 3.5$ atm) makes the tape 260 in the metal removing apparatus 200 move upwardly to separate the metal layer 245 on the sacrificial layer 246 from the surface of the wafer 240. The detailed description of the tape 260 and the metal layer 245 can be referred to the above relevant paragraphs.

The step shown in FIG. 1D could be replaced by the step shown in FIG. 1D' or FIG. 1D". Before performing the step shown in FIG. 1D' or FIG. 1D", the pressure P1 in the upper hollow cavity 210 and the pressure P2 in the lower hollow cavity 225 should be resumed to the same level (for example, P1=P2=1 atm). Then, the upper chamber body 210 is lifted and/or the lower chamber body 220 is lowered as shown in FIG. 1D'. Alternatively, the wafer carrier 230 is lowered by controlling the lifting shaft 235 so that the tape 260 can be moved opposite to the wafer 240 to separate the metal layer 245 on the sacrificial layer 246 from the wafer 240. The detailed description of the tape 260 and the metal layer 245 can be referred to the above relevant paragraphs.

Figure 1E:
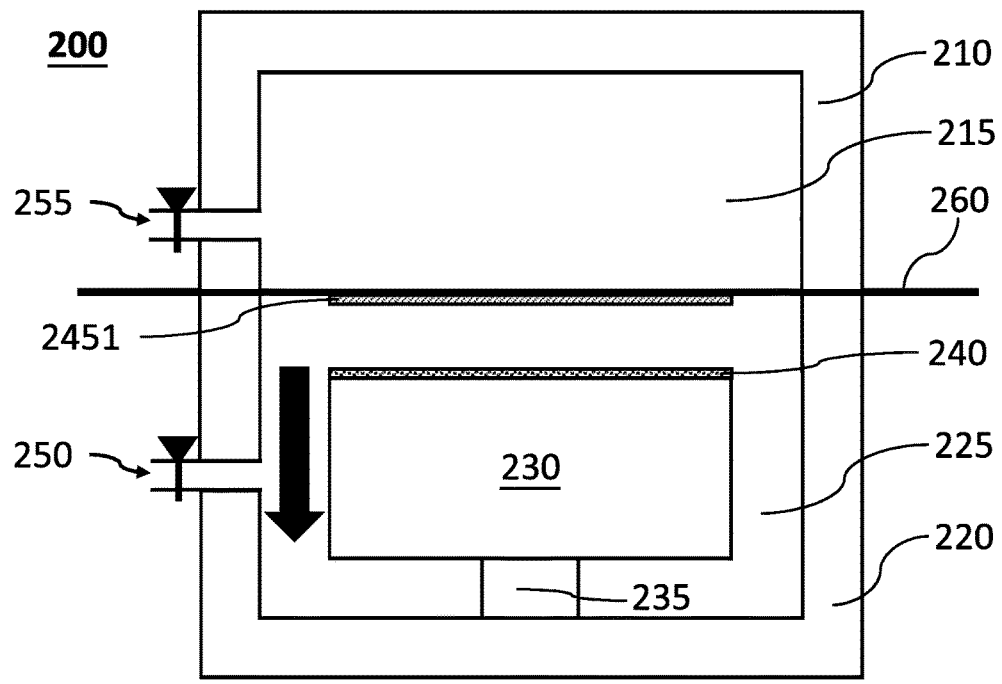
Figure 1E:
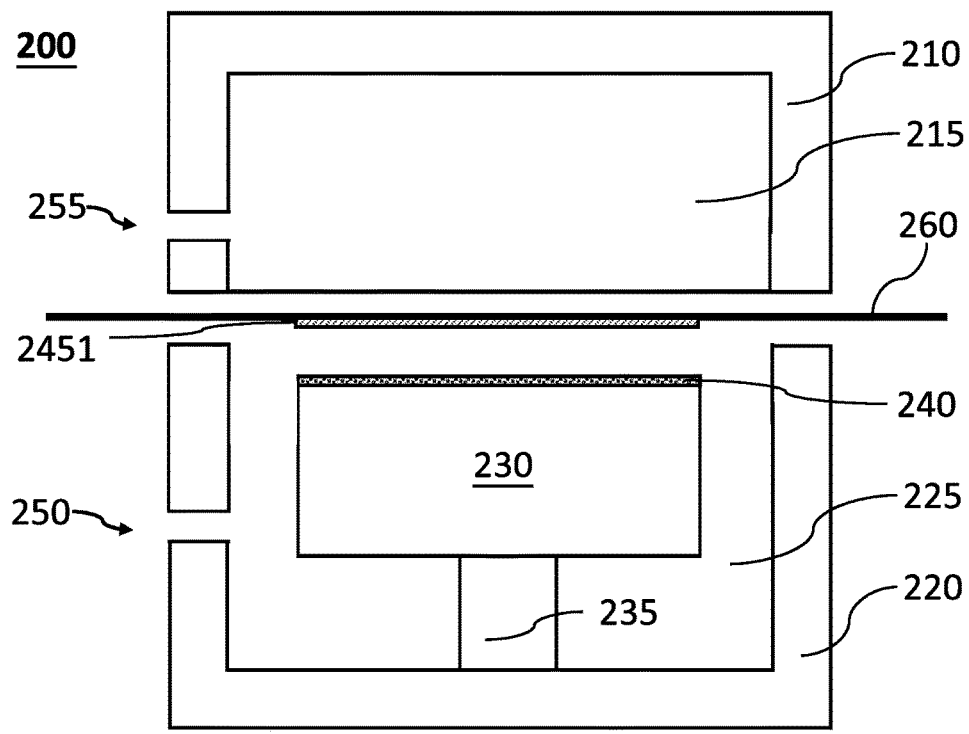

Then, referring to FIG. 1E, when the metal layer 245 on the sacrificial layer 246 is separated from the surface of the wafer 240 by the step shown in FIG. 1D, the tape 260 is under the expanded situation due to the pressure difference between the pressure P1 in the upper hollow cavity 210 and the pressure P2 in the lower hollow cavity 220. Thus, the pressure P1 in the upper hollow cavity 210 and the pressure P2 in the lower hollow cavity 220 should be resumed to the same level (for example: P1=P2=1 atm) to release the tape 260 from expansion to the unexpanded situation before performing next step (for example: P1=P2=1 atm). Then, the upper chamber body 210 is separated from the lower chamber body 220 as shown in FIG. 1E. When the metal layer 245 on the sacrificial layer 246 is separated from the surface of the wafer 240 by the step shown in FIGS. 1D' and 1D", the tape 260 is already under the unexpanded situation. Therefore, the upper chamber body 210 could be directly separated from the lower chamber body 220 as shown in FIG. 1E.

Finally, as shown in FIGS. 1A and 1E, the tape 260 with the metal structure 2451 adhered thereon passes through the second pressure roll 265C. Then the direction of the tape 260 is changed by the deflecting roll 265D and then the tape 260 is guided into the metal recycling tank 280 by the guiding roll 265E. The metal recycling liquid 285 in the metal recycling tank 280 is able to separate the metal structure 2451 from the tape 260, thus the metal structure 2451 suspends or precipitates in the metal recycling liquid 285 and is recycled and reused. The tape 260 without the metal structure 2451 can also be recycled and reused by the second roll 260B. Moreover, the metal recycling tank 280 can be further equipped with a scraper 290 which scraps the metal structure 2451 remaining on the tape 260 before the tape 260 leaves the metal recycling tank 280 and thus the recycling rate of the metal structure 2451 can be enhanced.

As shown in FIG. 4C, after the unnecessary metal (such as the metal layer 245 on the sacrificial layer 246) is removed, the sacrificial layer 246 can be removed by wet etching process and the wafer 240 can be cut into a plurality of the light-emitting chips.

Figure 2A:
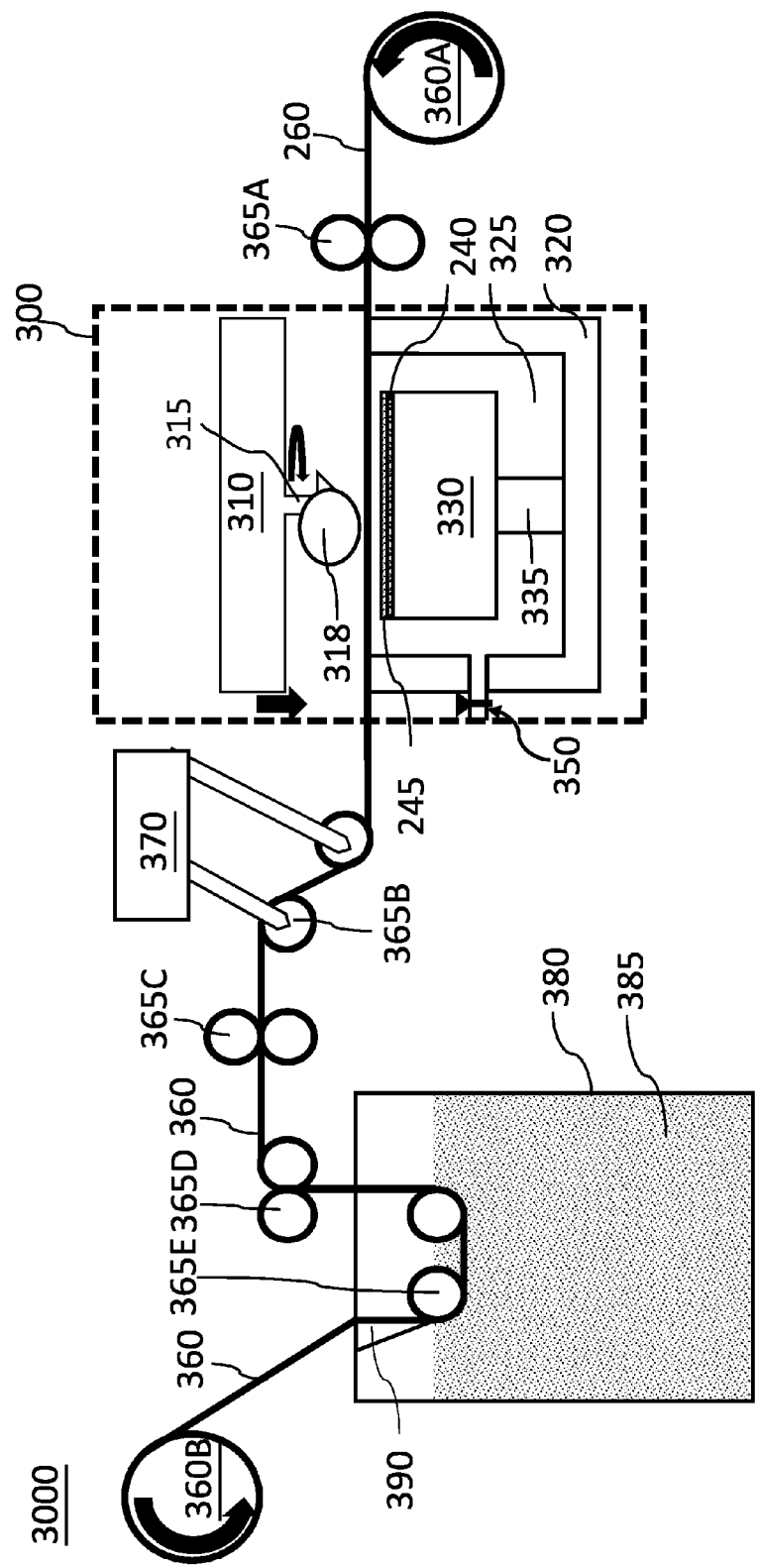
FIG. 2A shows the cross-sectional view of the metal recycling equipment in accordance with one embodiment of the present disclosure.

FIG. 2A shows the metal recycling equipment 3000 in accordance with one embodiment of the present disclosure. The metal recycling equipment 3000 comprises a first roll 360A, a tape 260 for recycling the metal, a metal removing apparatus 300, a moving roll 365B, a metal recycling tank 380, a guiding roll 365E and a second roll 360B. The metal removing apparatus 300 comprises a deformable chamber 318, a lower chamber body 320 comprising a third hollow cavity 325, and a third pressure controlling tube 350. A wafer carrier 330 and a lifting shaft 335 connecting to the wafer carrier 330 located in the third hollow cavity 325. The lifting shaft 335 could control the lift and the fall of the wafer carrier 330. The third pressure controlling tube 350 connects to the lower chamber body 320 to control the pressure in the third hollow cavity 325. The deformable chamber 318 and/or the lower chamber body 320 can controllably lift and fall. The moving roll 365B drives the tape 260 on the first roll 360A and makes the tape 260 go in and out of the metal removing apparatus 300. The metal recycling tank 380 fills with the metal recycling liquid 385, and the guiding roll 365E locates in the metal recycling tank 380 to guide the tape 260 from the metal removing apparatus 200 via the moving roll 265B into or out of the metal recycling tank 380. The second roll 360B is designated to recycle the tape 260.

The metal removing apparatus 300 further comprises a vertical moving member 310 connecting to the deformable chamber 318. Thus, when the vertical moving member 310 moves, the deformable chamber 318 is driven by the vertical moving member 310 and moves up and down relatively to the lower chamber body 320. Moreover, the metal removing apparatus 300 further comprises a rotating member 315 between the vertical moving member 310 and the deformable chamber 318. Likewise, when the rotating member 315 rotates, the deformable chamber 318 can be driven to rotate. The moving roll 365B is driven to rotate by the motor 370. Besides, the metal recycling equipment 3000 further comprises a first pressure roll 365A between the first roll 360A and the metal removing apparatus 300, a deflecting roll 365D between the moving roll 365B and the guiding roll 365E, and a second pressure roll 365C between the moving roll 365B and the deflecting roll 365D. The deflecting roll 365D is designated to deflect the tape 260 from the metal removing apparatus 300 via the moving roll 365B into the metal recycling tank 380.

The metal recycling liquid 385 in the embodiment could be water or organic solvent with temperature of 30~100 Celsius degree.

Figure 2B:
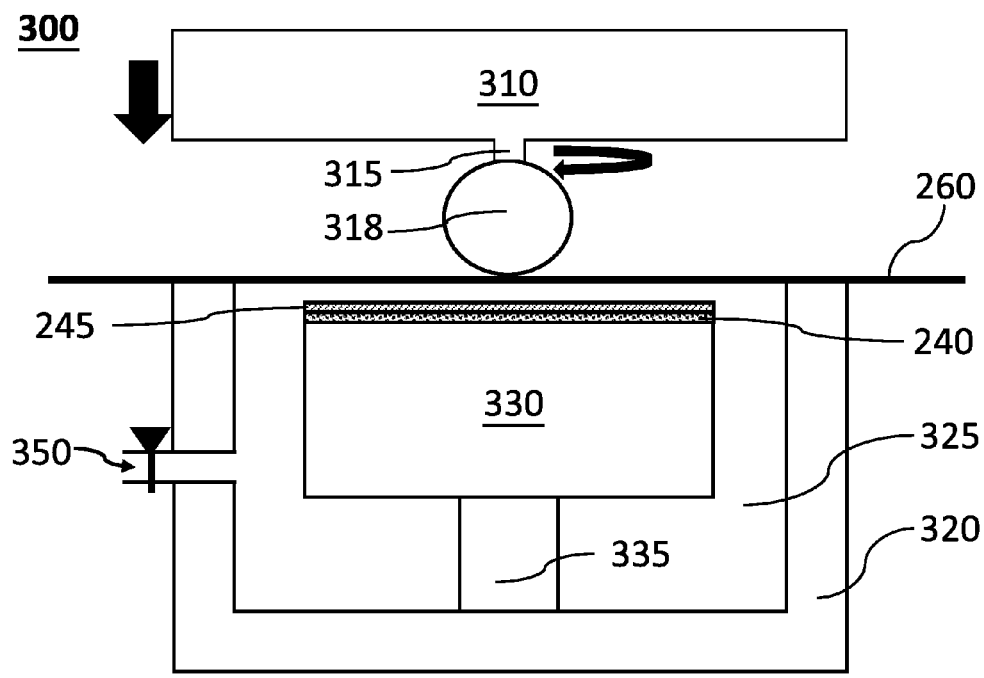
FIGS. 2B to 2E show the cross-sectional view of the metal recycling method for recycling the metal on wafer surface by using the metal removing equipment shown in FIG. 2A.
Figure 2C:
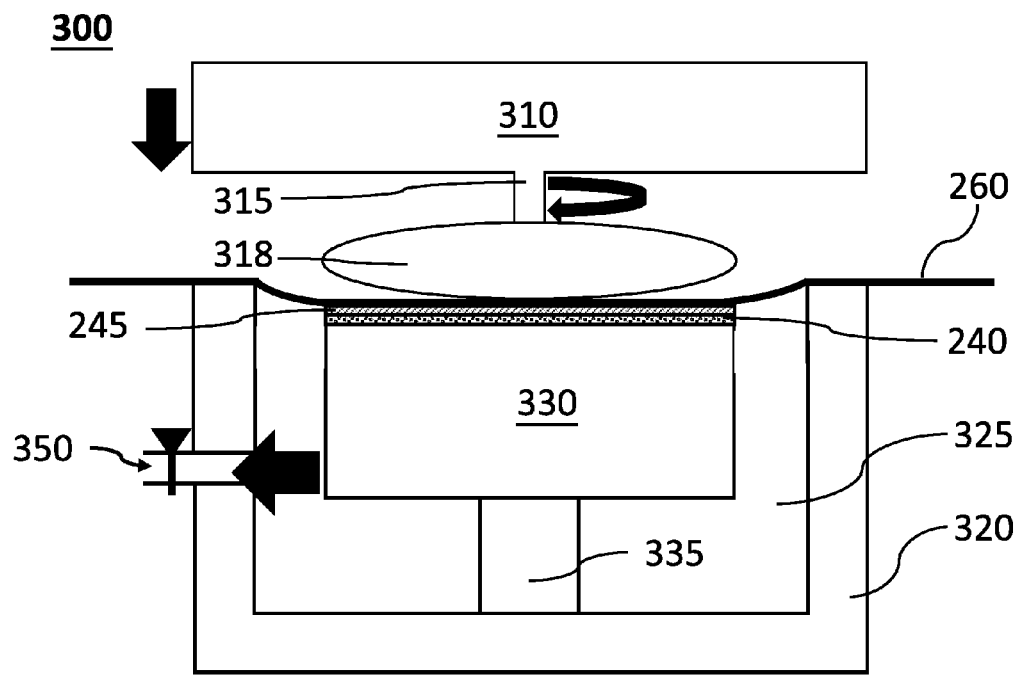
Figure 2D:
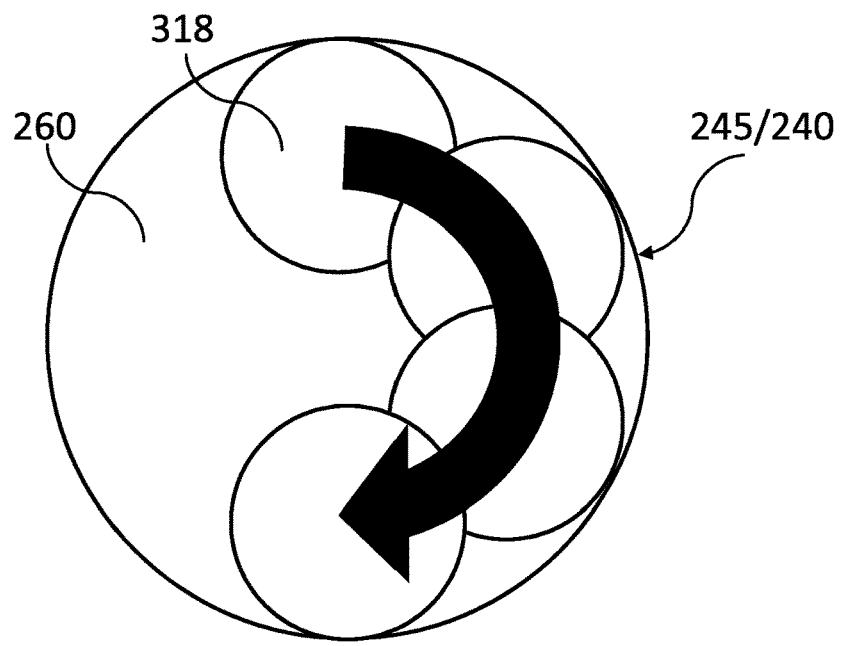
Figure 2D:
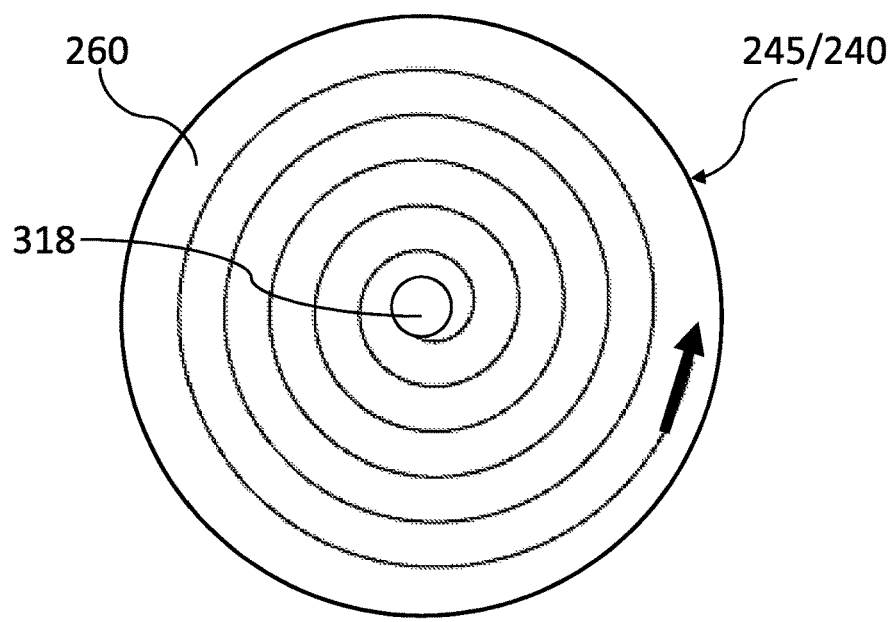

FIGS. 2B~2D show the cross-sectional view of the metal recycling method for recycling the metal on the surface of the wafer by using the metal removing apparatus shown in FIG. 2A The detailed description of the tape 260 and the wafer 240 can be referred to the relevant paragraphs with FIGS. 4A~4C.

A wafer 240 deposited on the wafer carrier 330 is shown in FIGS. 2B and 4A. The detailed description of the wafer 240 can be referred to above relevant paragraphs.

Referring to FIGS. 2A and 2B, when driven by the motor 370, the moving roll 365B motivates the tape 260 on the first roll 360A to enter the metal removing apparatus 300 through the first pressure roll 365A, and then the tape 260 is located between the deformable chamber 318 and the lower chamber body 320. A projected area of the third hollow cavity 325 which is projected toward the tape 260 should be located fully in a peripheral range of the tape 260, and more preferably, the projected area of the lower chamber body 320 which is projected toward the tape 260 also locates fully in the peripheral range of the tape 260. Then, the deformable chamber 318 falls and directly contacts with the tape 260 by the vertical moving member 310.

Referring to FIGS. 2C, 2D, 2D' and 4B, the deformable chamber 318 is inflated and expanded until the tape 260 is contacted so a force is applied to the tape 260. The deformable chamber 318 rolls and presses the tape 260 in order to evenly adhere the tape 260 to the wafer 240 and the metal layer 245 on the wafer surface when the deformable chamber 318 is activated by the rotating member 315. When the tape 260 is rolled and pressed, a path of the deformable chamber 318 could be a planetary moving path shown in FIG. 2D or a spiral moving path shown in FIG. 2D'. Besides, in other embodiments of the disclosure, the pressure P3 in the third hollow cavity 325 can be decreased to lower than 1 atm by exhausting the third hollow cavity 325 through the third pressure controlling tube 350 after the deformable chamber 318 applies the force to the tape 260. Therefore, the tape 260 adheres to the surface of the wafer 260 more rapidly, or the amount of bubbles formed between the tape 260 and the surface of the wafer 240 can be reduced.

In another embodiment, a part of the tape 260 firstly adheres to the center of the wafer 240, and then the rotating member 315 gradually moves outwardly to fully adhere the tape 260 to the surface of the wafer 240. Thus, the amount of bubbles formed between the tape 260 and the surface of the wafer 240 can be reduced.

Figure 2E:
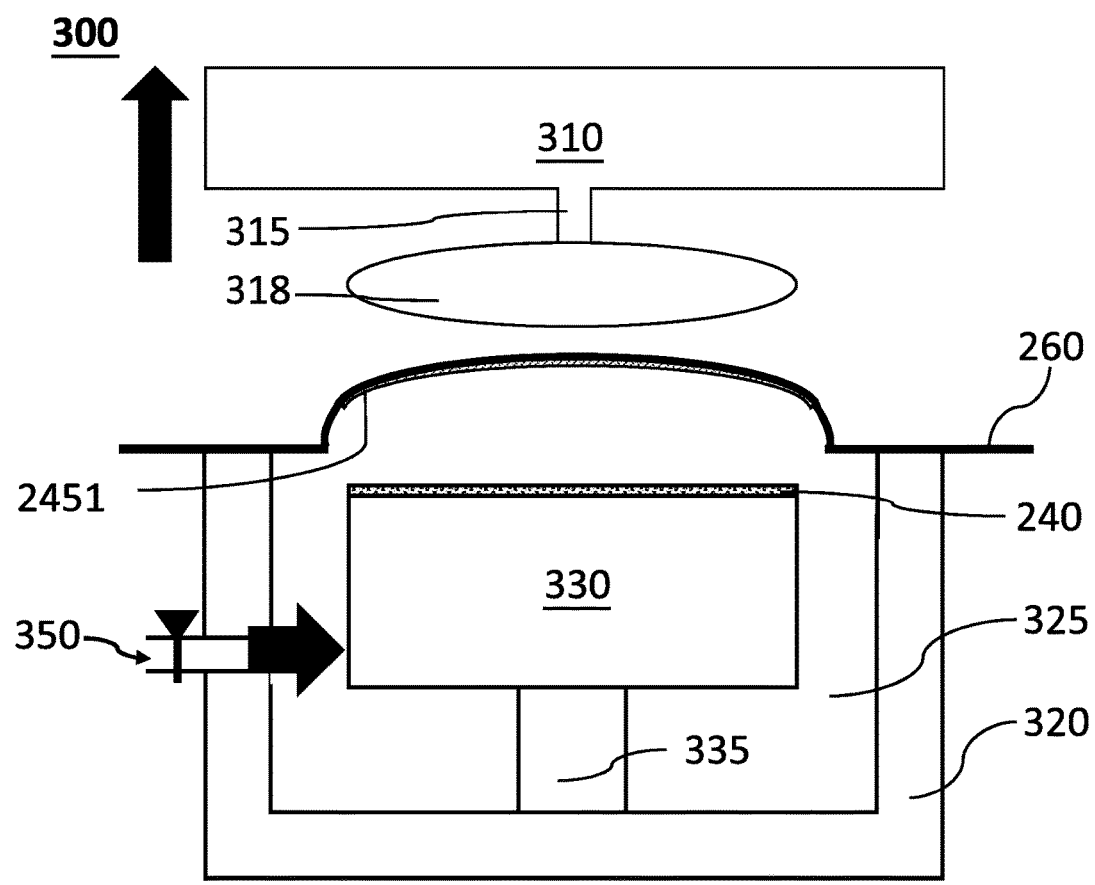

Referring to FIGS. 2E and 4C, the third hollow cavity 325 is inflated to increase the pressure P3 in the third hollow cavity 325 to 40~60 PSI (2.72~4.08 atm) through the third pressure controlling tube 350. The metal layer 245 on the sacrificial layer 246 is separated from the surface of the wafer 340, and then the tape 260 with the metal structure 2451 adhered thereon is moved out of the metal removing apparatus 300 via the moving roll 365B. Referring to the previous paragraphs so the relevant description will not repeat here.

Finally, as shown in FIG. 2A, the tape 260 with the metal structure 2451 adhered thereon passes through the second pressure roll 365C. The direction of the tape 260 is changed by the deflecting roll 365D, and then the tape 260 is guided into the metal recycling tank 380 by the guiding roll 365E. The metal recycling liquid 385 in the metal recycling tank 380 is able to separate the metal structure 2451 from the tape 260, thus the metal structure 2451 suspends or precipitates in the metal recycling liquid 285 and is recycled and reused. The tape 260 without the metal structure 2451 can also be recycled and reused by the second roll 260B. Moreover, the metal recycling tank 380 can be further equipped with a scraper 390 which scraps the structure layer 2451 remaining on the tape 260 before the tape 260 leaves the metal recycling tank 380 and thus the recycling rate of the metal structure 2451 can be enhanced.

Figure 3A:
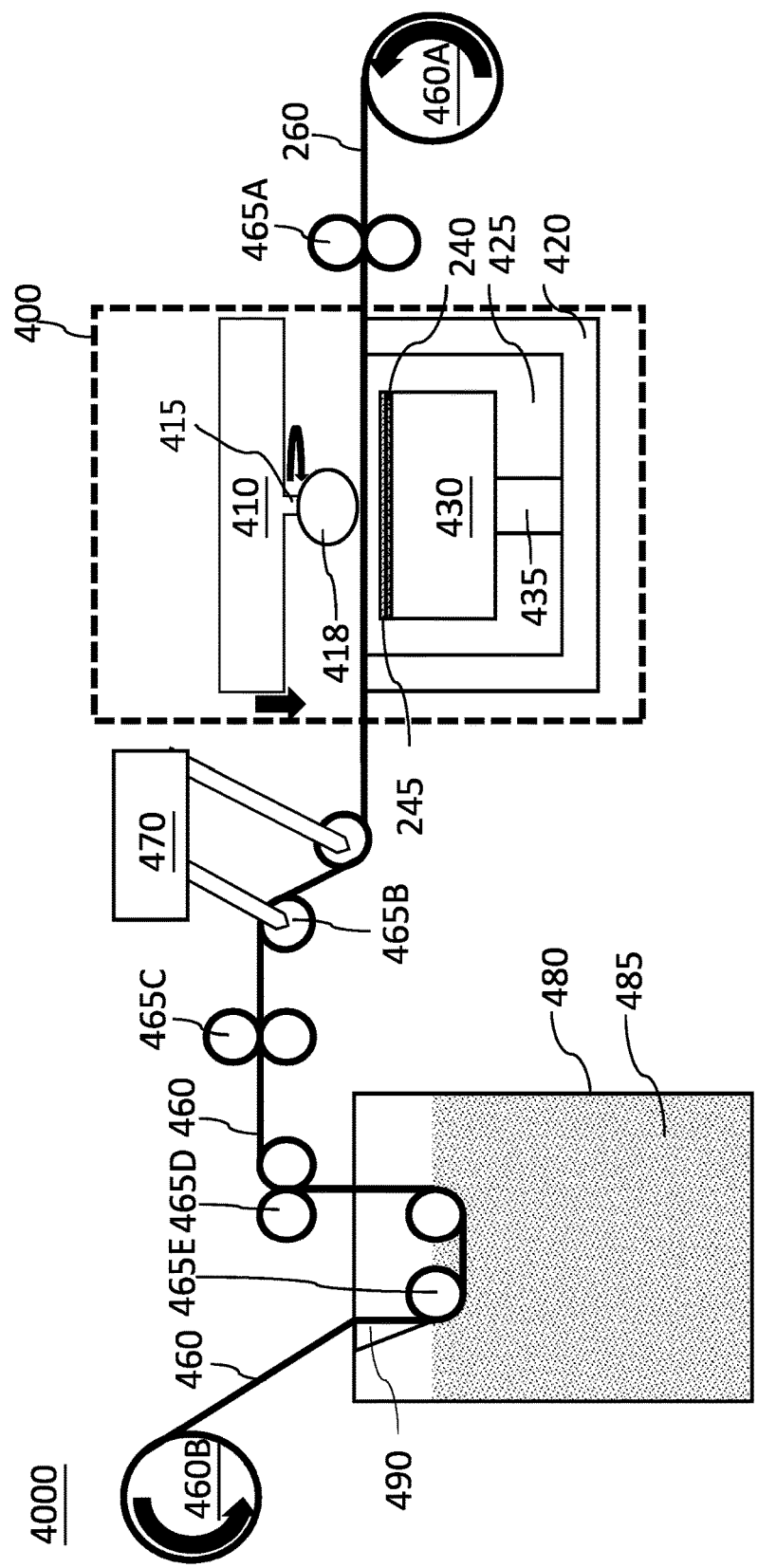
FIG. 3A shows the cross-sectional view of the metal recycling equipment in accordance with one embodiment of the present disclosure.

FIG. 3A shows the metal recycling equipment 4000 in accordance with one embodiment of the present disclosure. The metal recycling equipment 4000 comprises a first roll 460A, a tape 260 for recycling the metal, a moving roll 465B, a metal recycling tank 480, a guiding roll 465E and a second roll 460B. A metal removing apparatus 400 comprises a deformable chamber 418, a lower chamber body 420 comprising a third hollow cavity 425, a wafer carrier 430 and a lifting shaft 435 connecting to the wafer carrier 430 locating in the third hollow cavity 425. The lifting shaft 435 could control the lift and the fall of the wafer carrier 430. The deformable chamber 418 and/or the lower chamber body 420 can controllably lift and fall. The moving roll 465B drives the tape 260 on the first roll 460A, and make the tape 260 go in and out of the metal removing apparatus 400. The metal recycling tank 480 fills with the metal recycling liquid 485, and the guiding roll 465E locates in the metal recycling tank 480 to guide the tape 260 from the metal removing apparatus 200 via the moving roll 465B into or out of the metal recycling tank 480. The second roll 460B is designated to recycle the tape 260. The metal removing apparatus 400 further comprises a vertical moving member 410 connecting to the deformable chamber 418. Thus, when the vertical moving member 410 moves, the deformable chamber 418 is driven by the vertical moving member 410 and moves up and down relatively to the lower chamber body 420. The metal removing apparatus 400 further comprises a rotating member 415 between the vertical moving member 410 and the deformable chamber 418. The deformable chamber 418 can be driven to rotate when the rotating member 415 rotates. The moving roll 465B is driven to rotate by the motor 470. Moreover, the metal recycling equipment 3000 further comprises a first pressure roll 465A between the first roll 460A and the metal removing apparatus 400, a deflecting roll 465D between the moving roll 465B and the guiding roll 465E, and a second pressure roll 465C between the moving roll 465B and the deflecting roll 465D. The deflecting roll 465D is designated to deflect the tape 260 from the metal removing apparatus 400 through the moving roll 465B into the metal recycling tank 480.

The metal recycling liquid 485 in the embodiment could be water or organic solvent with temperature of 30~100 Celsius degree.

Figure 3B:
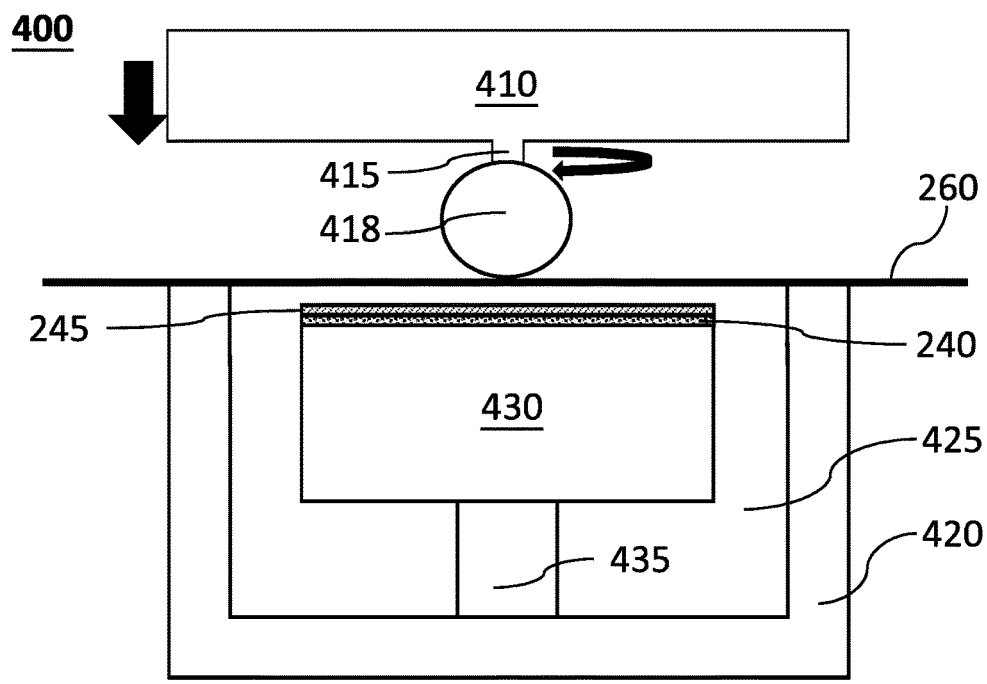
FIGS. 3B to 3D show the cross-sectional view of the metal recycling method for recycling the metal on wafer surface by using the metal removing equipment shown in FIG. 3A.
Figure 3C:
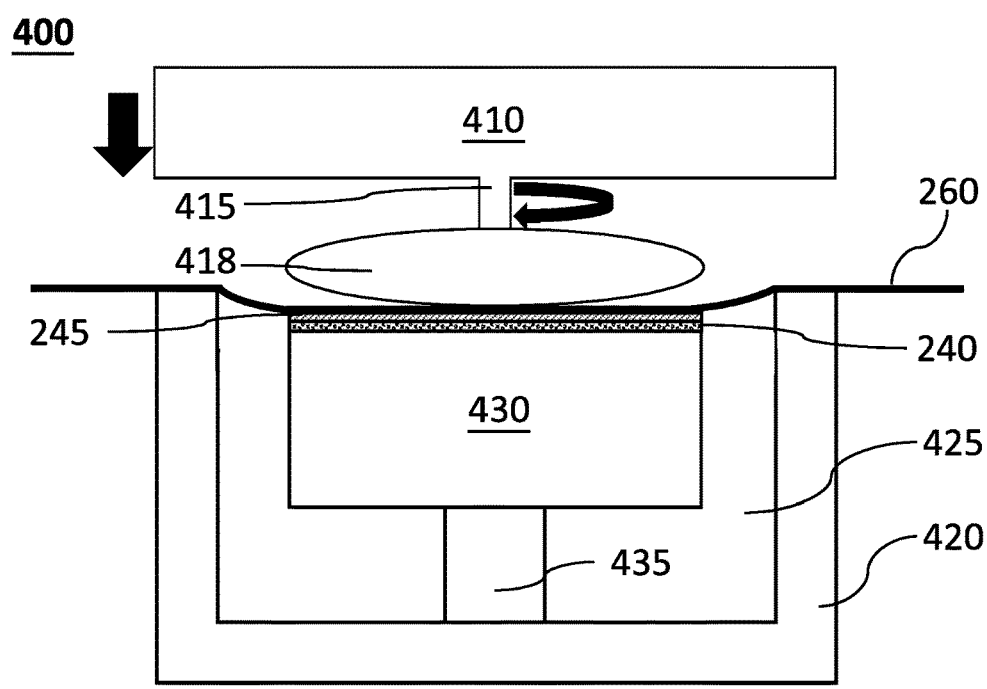
Figure 3D:
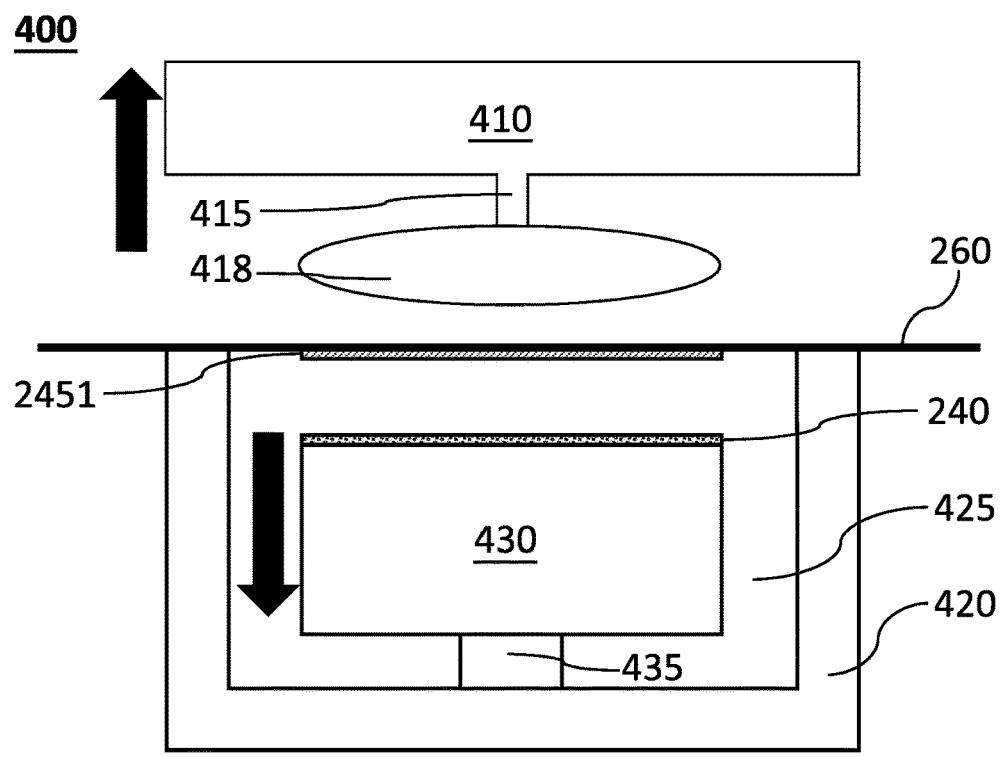
Figure 3D:
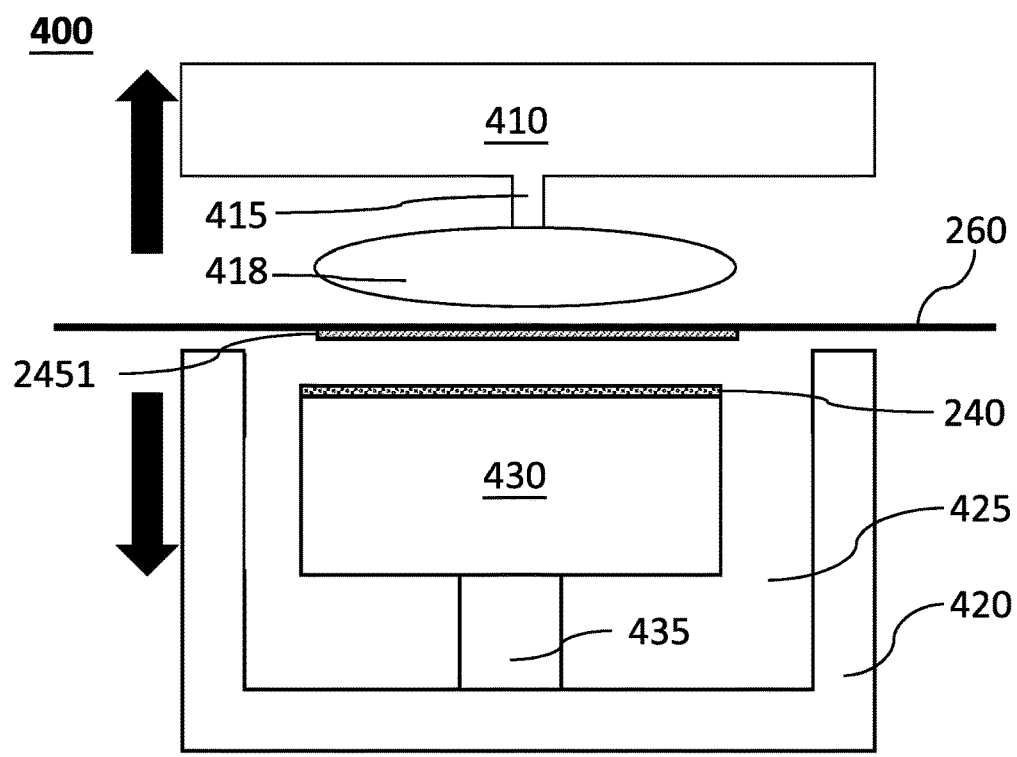

FIGS. 3B~3D show the cross-sectional view of the metal recycling method for recycling the metal on the surface of the wafer by using the metal removing apparatus shown in FIG. 3A The detailed description of the tape 260 and the wafer 240 can be referred to the relevant paragraphs with FIGS. 4A~4C.

A wafer 240 locates on the wafer carrier 430 as shown in FIGS. 2B and 4A. The detailed description of the wafer 240 can be referred to above relevant paragraphs.

Referring to FIGS. 3A and 3B, when driven by the motor 470, the moving roll 465B motivates the tape 260 on the first roll 460A to enter the metal removing apparatus 400 through the first pressure roll 465A, and then the tape 260 is located between the deformable chamber 418 and the lower chamber body 420. Then, the deformable chamber 418 falls and directly contacts with the tape 260 by the vertical moving member 410.

Then, referring to FIGS. 3C and 4B, the deformable chamber 418 is inflated and expanded until the tape 260 is contacted so a force is applied to the tape 260. The deformable chamber 418 rolls and presses the tape 260 in order to evenly adhere the tape 260 to the wafer 240 and the metal layer 245 on the surface of the wafer when the deformable chamber 318 is activated by the rotating member 315. When the tape 260 is rolled and pressed, a path of the deformable chamber 418 could be a planetary moving path shown in FIG. 2D or a spiral moving path shown in FIG. 2D'.

Referring to FIG. 3D, after the deformable chamber 418 is lifted by the vertical moving member 410, the lifting shaft 435 drives the wafer carrier 430 to fall. Thus, the metal layer 245 on the sacrificial layer 246 can be separated from the surface of the wafer 240.

The step shown in FIG. 3D can be replaced by the step shown in FIG. 3D'. As shown in FIG. 3D', the tape 260 moves oppositely to the wafer 240 and the metal layer 245 on the sacrificial layer 246 is separated from the surface of the wafer 240 through lowing the lower chamber body 420. Then, the tape 260 with the metal structure 2451 adhered thereon is moved out of the metal removing apparatus 400 by the moving roll 465B.

Finally, as shown in FIG. 3A, the tape 260 with the metal structure 2451 adhered thereon passes through the second pressure roll 465C. The direction of the tape 260 is changed by the deflecting roll 465D, and then the tape 260 is guided into the metal recycling tank 480 by the guiding roll 465E. The metal recycling liquid 485 in the metal recycling tank 480 is able to separate the metal structure 2451 from the tape 260, thus the metal structure 2451 suspends or precipitates in the metal recycling liquid 485 and is recycled and reused. The tape 260 without the metal structure 2451 can also be recycled and reused by the second roll 460B. Moreover, the metal recycling tank 480 can be further equipped with a scraper 490 which scraps the metal structure 2451 remaining on the tape 260 before the tape 260 leaves the metal recycling tank 480 and thus the recycling rate of the metal structure 2451 can be enhanced.

The metal layer 245 comprises gold, silver, platinum, aluminum or copper. The semiconductor structure 242 in the disclosure is a light-emitting diode and comprises a first type semiconductor, an active layer, and a second type semiconductor layer. In the other embodiment, the semiconductor structure comprises the diode other than LED, transistor, or other active component or passive component.

It should be noted that the proposed various embodiments are not for the purpose to limit the scope of the disclosure. Any possible modifications without departing from the spirit of the disclosure may be made and should be covered by the disclosure. The range of the protective right is defined by the following claims.

What is claimed is:

1. A metal recycling method, which comprises:
    attaching a tape to a metal layer of a semiconductor structure, and wherein the metal layer comprises gold, silver, platinum, aluminum or copper; and
    providing a first pressure difference to separate a part of the metal layer from the semiconductor structure and transfer the part of the metal layer to the tape.

2. The metal recycling method of claim 1, wherein the first pressure difference is 1.5 atm to 3.5 atm.

3. The metal recycling method of claim 1, further comprising providing a second pressure difference to attach the tape to the metal layer of a semiconductor structure.

4. The metal recycling method of claim 1, wherein the semiconductor structure comprises a semiconductor stack, an electrode formed on the semiconductor stack, a sacrificial layer formed on the semiconductor stack and not deposited on the electrode, and the metal layer formed on the electrode and the sacrificial layer.

5. The metal recycling method of claim 4, wherein the part of the metal layer deposited on the sacrificial layer is transferred to the tape.

6. The metal recycling method of claim 5, wherein another part of the metal layer on the electrode remains on the semiconductor structure after the part of the metal layer is transferred to the tape.

7. The metal recycling method of claim 1, further comprising providing a metal recycling equipment comprising the tape and a metal removing apparatus wherein the tape is located, and wherein the metal removing apparatus comprises an upper hollow cavity and a lower hollow cavity on the opposite sides of the tape.

8. The metal recycling method of claim 7, wherein the first pressure difference is achieved by inflating the lower hollow cavity.

9. The metal recycling method of claim 8, wherein a first pressure in the lower hollow cavity is inflated to 40~60 PSI when separating the part of the metal layer from the semiconductor structure.

10. The metal recycling method of claim 3, further comprising providing a metal recycling equipment comprising the tape and a metal removing apparatus wherein the tape is located, and wherein the metal removing apparatus comprises an upper hollow cavity and a lower hollow cavity on the opposite sides of the tape.

11. The metal recycling method of claim 10, wherein the second pressure difference is achieved by inflating the upper hollow cavity.

12. The metal recycling method of claim 11, wherein a second pressure in the upper hollow cavity is inflated to 40~60 PSI when attaching the tape to the metal layer.

13. The metal recycling method of claim 10, wherein the second pressure difference is achieved by exhausting the lower hollow cavity.

14. The metal recycling method of claim 7, wherein the metal recycling equipment further comprises a deformable chamber which is able to change its size in the upper hollow cavity, and the tape is attached to the metal layer through pressing the tape toward the metal layer by the deformable chamber.

15. The metal recycling method of claim 14, wherein the metal recycling equipment further comprises a rotating member to drive the deformable chamber to rotate.

16. The metal recycling method of claim 14, wherein a path of the deformable chamber is a planetary moving path or a spiral moving path when the tape is pressed by the deformable chamber.

17. The metal recycling method of claim 7, wherein the metal recycling equipment further comprises a carrier and a lifting shaft in the metal recycling equipment, and the lifting shaft connects to the carrier to control the lift and the fall of the carrier.

18. The metal recycling method of claim 7, wherein the metal recycling equipment further comprises a pressure controlling tube connecting to the upper hollow cavity or a lower hollow cavity.

19. The metal recycling method of claim 7, wherein the metal recycling equipment further comprises a metal recycling tank.

\* \* \* \* \*